US005237223A

United States Patent [19]

Song

[11] Patent Number: 5,237,223

[45] Date of Patent: Aug. 17, 1993

[54] MODE DETECTOR FOR MULTIMODE MONITOR

[75] Inventor: Moon J. Song, Suweon, Rep. of Korea

[73] Assignee: Samsung Electronics Co., Ltd., Suweon, Rep. of Korea

[21] Appl. No.: 947,886

[22] Filed: Sep. 18, 1992

Related U.S. Application Data

[63] Continuation-in-part of Ser. No. 635,468, Dec. 28, 1990, abandoned.

[30] Foreign Application Priority Data

Jun. 13, 1990 [KR] Rep. of Korea ................ 90-8314[U]

[51] Int. Cl.$^{5}$ ................................ H03K 9/06

[52] U.S. Cl. .................................. 307/528; 328/138; 307/519

[58] Field of Search ............... 307/528, 525, 519, 479; 328/138; 358/158, 148, 188, 139, 10

[56] References Cited

U.S. PATENT DOCUMENTS

| | | | |
|---|---|---|---|
| 4,779,132 | 10/1988 | McBeath et al. | 358/148 |
| 4,814,878 | 3/1989 | Kishi et al. | 358/148 |
| 4,855,826 | 8/1989 | Wischermann et al. | 358/139 |
| 4,916,442 | 4/1990 | Kim | 340/814 |

*Primary Examiner*—Jin F. Ng
*Assistant Examiner*—Sinh Tran
*Attorney, Agent, or Firm*—Ladas & Parry

[57] ABSTRACT

A mode detector of a multimode monitor comprising a band separation circuit for separating band of input vertical and horizontal frequencies to provide logic signals, a control signal generation circuit for providing mode control signals, and a mode control circuit for controlling each mode of the multimode monitor.

According to the present invention, the vertical and horizontal sizes, the vertical and horizontal oscillating frequencies, the horizontal pin cushion and the like can be automatically controlled according to the mode of input frequencies by detecting the mode of the input frequencies in the control signal generation circuit and by providing the combined logic signals of the control signal generation circuit to the mode control circuit.

4 Claims, 3 Drawing Sheets

MODE DETECTOR FOR MULTIMODE MONITOR

This is a continuation-in-part of copending application Ser. No. 07/635,468 filed on Dec. 28, 1990, now abandoned.

BACKGROUND OF THE INVENTION

The present invention relates to a multimode monitor and, more particularly, to a mode detector of a multimode monitor, which detects a frequency mode applied to the multimode monitor and provides a mode signal to control the multimode monitor.

As the technology related to a computer has been developed, horizontal and vertical frequency bands are more varied. In a VGA (video graphic array) mode, the vertical frequency is generally 60 Hz or 70 Hz and the horizontal frequency is 31.5 KHz. Also, in an extended VGA mode, each horizontal and vertical frequency is 35.5 KHz and 86 Hz, respectively. Recently, in a strong VGA mode, 56 Hz or 60 Hz is used as the vertical frequency and 35.5 KHz or 37.5 KHz is used as the horizontal frequency. Thus, the multimode monitors are required to convert the mode according to various horizontal and vertical frequencies.

FIG. 1 shows an example of a conventional multimode monitor. In the conventional multimode monitor, the input vertical and horizontal frequency signals are converted to a constant voltage level by a vertical frequency-to-voltage converter 10 and a horizontal frequency-to-voltage converter 20, respectively.

According to output voltages of the vertical and horizontal frequency-to-voltage converters 10 and 20, vertical and horizontal frequency band separators 60 and 30 distinguish bands of respective input vertical and horizontal frequencies to control vertical and horizontal switching circuits 70 and 80, respectively. Then, the vertical and horizontal switching circuits 70 and 80 change respective internal oscillating vertical and horizontal frequencies according to the input vertical and horizontal frequencies. In such multimode monitors, the internal oscillating vertical and horizontal frequencies are respectively synchronized with by the input vertical and horizontal frequencies to focus a screen synchronously with the input frequencies.

However there is a problem that vertical and horizontal sizes, positions, and horizontal pin cushion should be controlled accurately according to the input vertical and horizontal frequency modes so that those are to be controlled manually by users.

SUMMARY OF THE INVENTION

The present invention has an object to provide a mode detector for multimode monitors, which controls the modes of monitor automatically according to the input vertical and horizontal frequency mode under the control of a internal control-signal generation means.

According to the present invention, there is provided a mode detector of a multimode monitor comprising: a band separation circuit for separating respective bands input vertical and horizontal frequencies and for providing logic signals; a control signal generation circuit connected to said band separation circuit for providing mode control signals by combining said logic signals of said band separation circuit; and a mode control circuit for controlling each mode of the multimode monitor according to said control signals of said control signal generation circuit.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENTS

The present invention will now be described in more detail with reference to the accompanying drawings.

Figure 1:
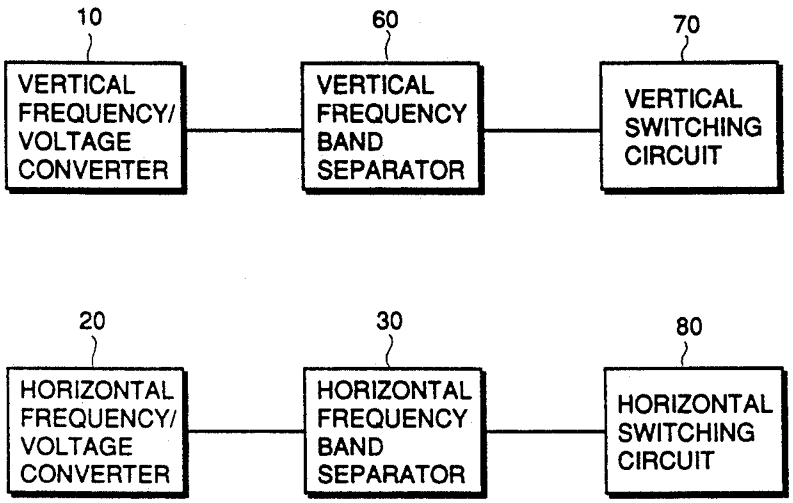
FIG.1 (PRIOR ART)
FIG. 1 is a block diagram of a mode detector for a conventional multimode monitor.
Figure 2:
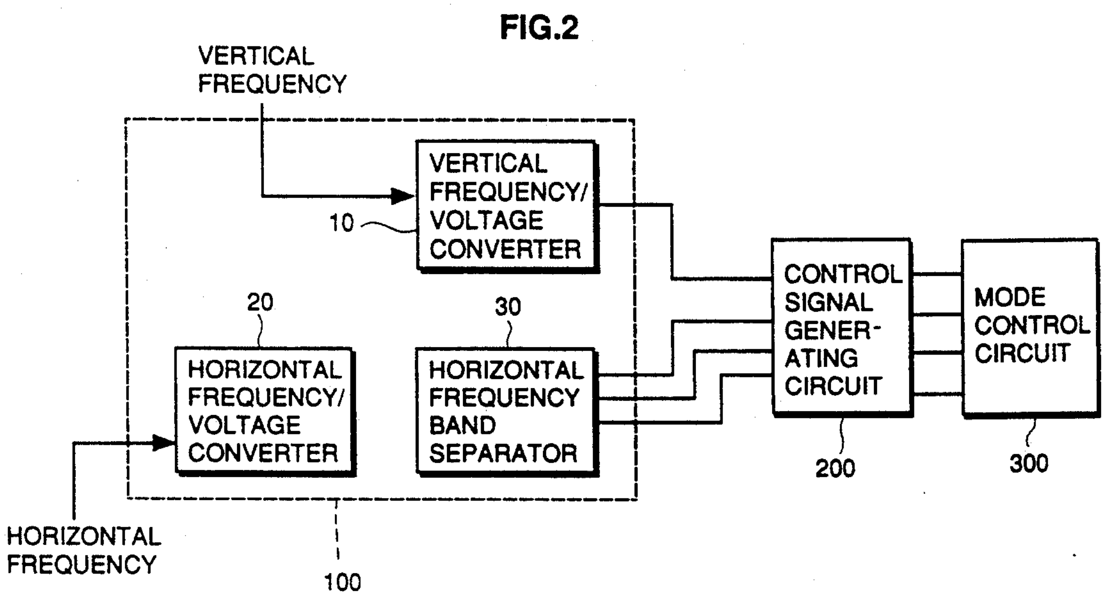
FIG. 2 is a block diagram of a mode detector for a multimode monitor according to the present invention.

FIG. 2 shows a block diagram of a mode detector for a multimode monitor according to the present invention, which comprises a band separation circuit 100, a control signal generation circuit 200, and a mode control circuit 300.

To described in detail, the band separation circuit 100 distinguishes bands of each input vertical and horizontal frequency to provide logic signals and includes a V-F/V converter (vertical frequency-to-voltage converter) 10 which provides a high level signal when the input vertical frequency is higher than a predetermined frequency, a H-F/V converter(horizontal frequency-to-voltage converter) 20 which provides a dc voltage in proportion to the input horizontal frequency, and a horizontal frequency band separator 30 which provides a logic signal by recognizing the voltage level of the H-F/V converter 20.

Figure 3:
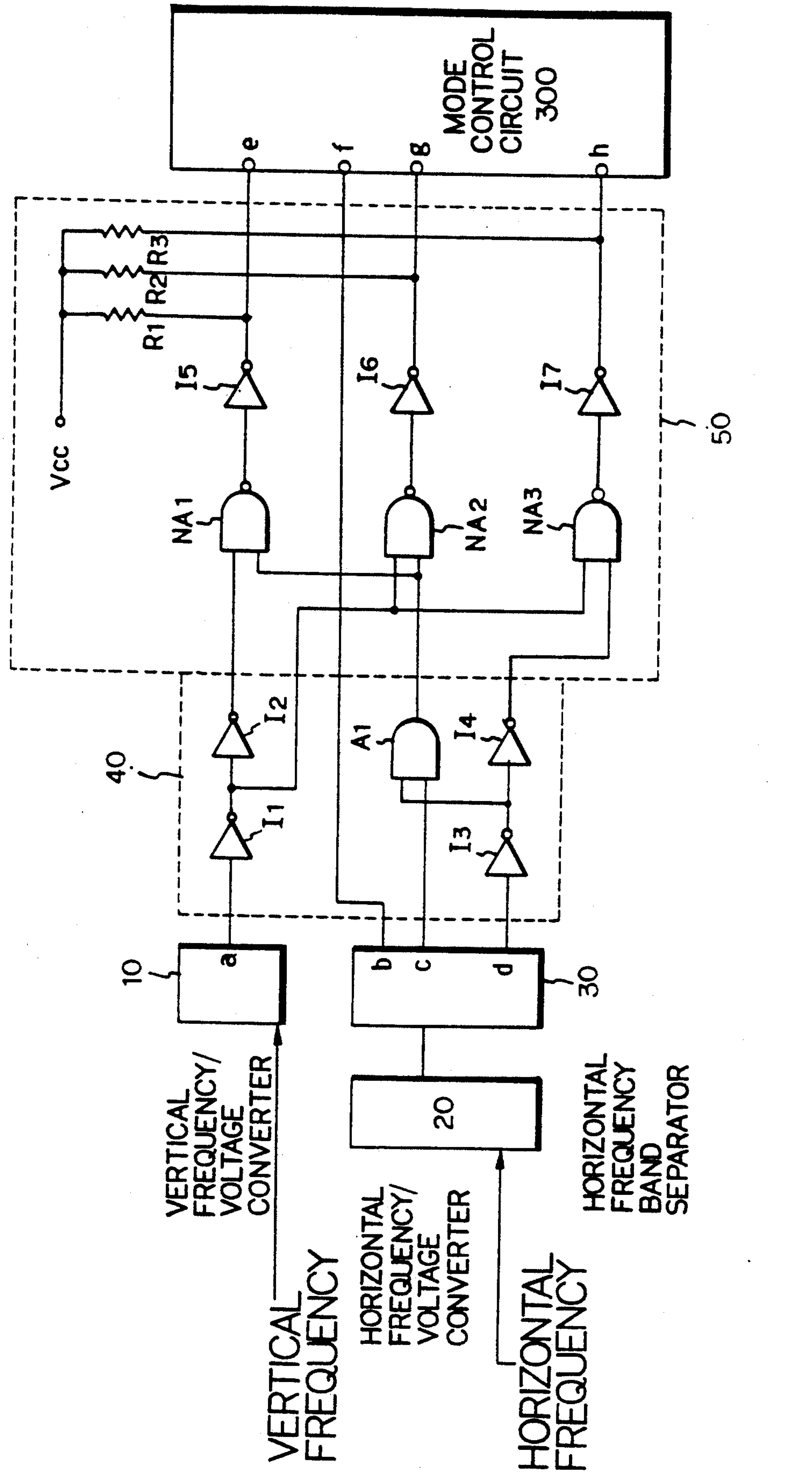
FIG. 3 a control signal generation circuit according to the present invention.

As shown in FIG. 3, the control signal generation circuit 200 includes a first logic combination part 40 and a second logic combination part 50. In FIG. 3, the output voltage level of the V-F/V converter 10 becomes high when the input vertical frequency is lower than 60 Hz, while it becomes low when the input vertical frequency is higher than 70 Hz.

On the other hand, the mode-control circuit 300 enters a video graphic array (VGA) mode when input signals of terminals e,f,g, and h are "0110", where 1 and 0 represent logic-high and logic-low, respectively. Similarly, the mode control circuit 300 enters the extended video graphic array (EVGA) mode when the input data is "1000", while the mode control circuit 300 enters the strong video graphic array 1 (SVGA-1) mode when the input data is "0010" and the strong video graphic array 2 (SVGA-2) mode when the input when the input data is "0001". Also, the horizontal frequency band separator 30 provides signals "100" through terminals b,c, and d when the input horizontal frequency applied to the H-F/V converter 20 is 31.5 KHz. Similarly, the horizontal frequency band separator 30 provides "001" for the input horizontal frequency of 35.5 KHz and "011" for the input horizontal frequency of 37.5 KHz.

Next, the first logic combination circuit 40 in the control signal generation circuit 200 includes four inverters 11–14 and an AND gate A1. Two inverters 11 and 12 are connected in series to the output terminal of the V-F/V converter 10, while the other two inverters 13 and 14 are connected in series to the output terminal (d) of the horizontal frequency band separator 30.

Another output terminal (c) of the horizontal frequency b and separator 30 and the output terminal of the inverter are connected to the input terminals of an AND gate A1, respectively. The second logic combination circuit 50 includes three inverters I5–I7 and three NAND gates NA1–NA3, where output signals of the inverter I2 and the AND gate A1 in the first logic combination part 40 are respectively applied to two input terminals of the NAND gate NA1 in the second logic combination circuit 50 and also the output signals of the inverter I1 are applied to two input terminals of the NAND gate NA2 in the second logic combination part 50.

Also, the output signals of AND gate A5–A7 are applied to input terminals (e), (g), and (h) of the mode control circuit 300 respectively. Three pull-up resistors R1–R3 are connected to the output terminals of the inverters I5–I7, respectively.

On the other hand, the output signal of the terminal (b) of the horizontal frequency band separator 30 is directly applied to the input terminal (f) of the mode control circuit 300. The mode control circuit 300 controls the mode of the monitor according to the combination of the logic signals applied to the input terminals (e), (f), (g), and (h).

If the vertical frequency of 60 or 70 Hz and the horizontal frequency of 31.5 KHz are applied to the mode detector in FIG. 3 in the VGA mode, the output of the V-F/V converter 10 may be either "1" or "0", that is, "don't-care" state, while the output voltage of the terminal (b) of the horizontal frequency band separator 30 become "1" and the output voltages of the terminals (c) and (d) are commonly "0". Then, an input terminal of the NAND gate NA3 is set to be "0" through the inverters I3 and I4 and thus the output voltage of the NAND gate NA3 becomes "1" independently of the output voltage of the inverter I1. Thus, the input terminal (h) of the mode control circuit 300 is set to be "0". On the other hand, the output voltage of the AND gate A1 becomes "0" since the voltage at the terminal (c) of the horizontal frequency band separator 30 is "0". Then, the output voltages of the NAND gates NA1 and NA2 become commonly "1" independently of the outputs of the inverters I1 and I2, and thus the input terminals (e) and (g) of the mode control circuit 300 are set to be "0". On the other hand, the input terminal (f) of the mode control circuit 300 is set to be "1" since the voltage level at the output terminal (h) of the horizontal frequency band separator 30 is "1". Thus, the mode control circuit 300 recognizes that the present vertical and horizontal frequencies are in the VGA mode according to the input signal "0100" at the input terminals (e), (f), (g), and (h) controls the internal vertical and horizontal oscillating frequencies, the vertical and horizontal sizes, the positions, and the horizontal Pin-cushion of the monitor in the VGA mode.

Similarly, for the vertical frequency of 86 Hz and the horizontal frequency of 35.5 KHz, the voltage level at the output terminal (a) of the V-F/V converter 10 becomes "1" and the output terminals (b), (c), and (d) of the horizontal frequency band separator 30 become "0", "1", and "0", respectively. In the first and second logic combination circuits 40 and 50, then, the input terminals (e), (f), (g), and (h) of mode control circuit 300 are respectively set to be "1", "0", "0", and "0". Then the mode control circuit 300 recognizes the input vertical and horizontal frequencies are in the EVGA mode and controls the monitor for the EVGA mode.

For the vertical frequency of 56 Hz and the horizontal frequency of 35.5 KHz, the voltage level at the output terminal of the V-F/V converter 10 become "0" and the voltage level at the terminal of the horizontal frequency band separator 30 becomes "1" and that of the other terminals becomes "0". Thus, the mode control circuit 300 recognizes that the input vertical and horizontal frequencies are in the SVGA-1 mode, so the mode control circuit 300 control the monitor for the SVGA-1 mode.

In the similar manner, at the vertical frequency of 60 Hz and the horizontal frequency of 37.5 KHz, the mode control circuit 300 controls the monitor in the SVAG-2 mode. The above mentioned operation is summarized by the table 1 as follows:

TABLE 1

| CARD Q2 V/H-frequency | VGA V:60.70 Hz H:31.5 KHz | EVGA V:86 Hz H:35.5 KHz | SVGA-1 V:56 Hz H:35.5 KHz | SAGA-2 V:60 Hz H:37.5 KHz |
|---|---|---|---|---|
| terminal | | | | |
| a | x | 1 | 0 | 0 |
| b | 1 | 0 | 0 | 0 |
| c | 0 | 1 | 1 | 1 |
| d | 0 | 0 | 0 | 1 |
| e | 0 | 1 | 0 | 0 |
| f | 1 | 0 | 0 | 0 |
| g | 0 | 0 | 1 | 0 |
| h | 0 | 0 | 0 | 1 |

(x: Don't care state)

As mentioned above, the present invention can automatically control the vertical and horizontal synchronized-oscillating frequencies, the vertical and horizontal sizes, and the horizontal pin cushion of the monitor according to the mode of the input vertical and horizontal frequencies by detecting the mode of the input frequencies in the control signal generation circuit and by providing the combined logic signals of the control signal generation circuit to the mode control circuit.

Figure 2A:
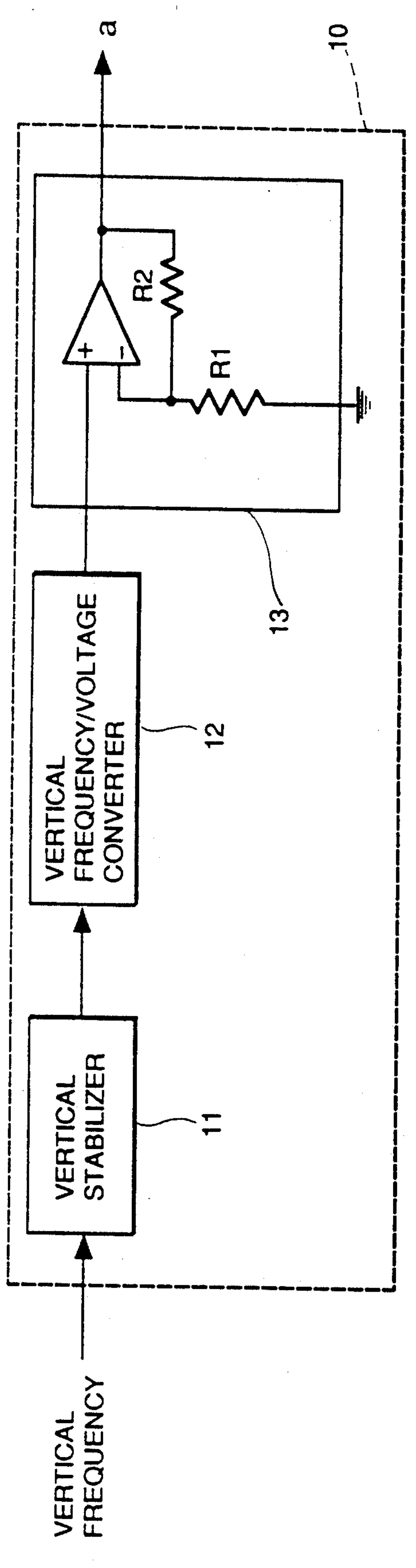

FIG. 2A shows a detailed block diagram of the vertical frequency voltage converter(10) of the band separation circuit (100). It comprises a vertical stabilizer(11) for converting and stabilizing the vertical frequency provided through the vertical frequency terminal into a positive polarity no matter which is a positive polarity or a negative polarity: a vertical frequency voltage converter(12) for converting the vertical frequency converted into a positive polarity in said vertical stabilizer(11) into a voltage; a vertical frequency band separator(13) for comparing the output of said vertical frequency voltage converter(12) with a reference voltage and providing a high level signal through a terminal(a) in case that the output is higher than the reference voltage.

In this respect, the vertical frequency band separator(13) can be constituted by using the conventional OP AMP. The reference voltage to be provided to the vertical frequency band separator(13) is arbitrarily determined as desired, i.e., 5 V or 10 V.

Figure 2B:
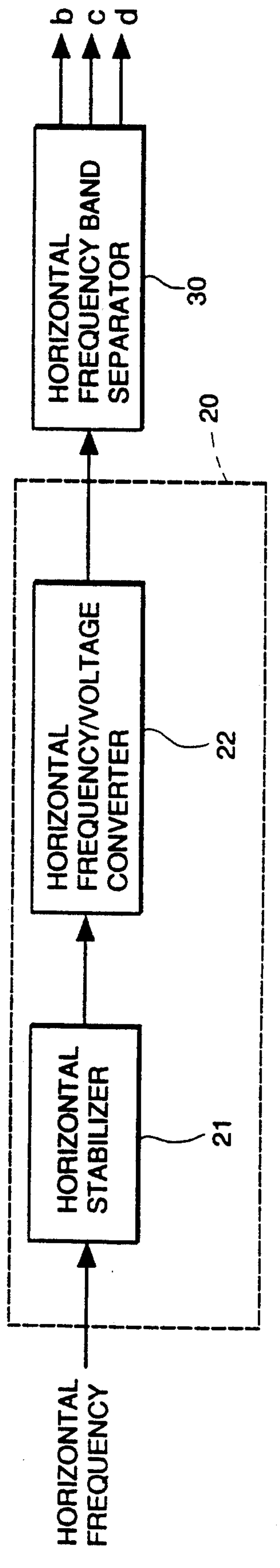

The FIG. 2B shows a detailed block diagram of the horizontal voltage converter(20) of the band separation circuit(100). It comprises a horizontal stabilizer(21) for converting and stabilizing the horizontal frequency provided through the horizontal frequency terminal into a positive polarity no matter which is a positive polarity or a negative polarity; and a horizontal frequency voltage converter(22) for converting the horizontal frequency converted into a positive polarity in said horizontal stabilizer(21) into a voltage.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of he present invention.

What is claimed is:

1. In a mode detector of a multimode monitor including a mode control circuit for controlling a mode of monitor by being switched according to an applied control signal, said detector comprising:

a band separation circuit for separating inputted vertical and horizontal frequency signals according to band and for providing a plurality of logic signals, said band separation circuit including:

a vertical frequency-to-voltage converter coupled to a source of said vertical frequency signal for providing a high level signal when the input vertical frequency is higher than a predetermined frequency;

a horizontal frequency-to-voltage converter coupled to a source of said horizontal frequency signal for providing a dc voltage in proportion to the input horizontal frequency; and a horizontal frequency band separator coupled to said horizontal frequency-to-voltage converter for providing logic signals according to the output level of said horizontal frequency-to-voltage converter;

a control signal generating circuit composed of first and second logic combination circuits for combining the logic signals applied from said band separation circuit and for providing a combined logic signal to said mode control circuit.

2. Apparatus according to claim 1 wherein said first logic combination circuit includes first and second inverters connected to said vertical frequency-to-voltage converter, third and fourth inverters connected to said horizontal frequency band separator, and an AND gate connected to said horizontal frequency-band separator and said third inverter; and wherein said second logic combination circuit includes three NAND gates coupled to said first, second and fourth inverters and the AND gate in said first logic combination circuit and three inverters respectively connected to said three NAND gates.

3. In a mode detector of a multimode monitor including a mode control circuit for controlling a mode of monitor by being switched according to an applied control signal, said detector comprising:

a band separation circuit for separating inputted vertical and horizontal frequency signals according to band and for providing a plurality of logic signals;

a control signal generating circuit composed of first and second logic combination circuits for combining the plurality of logic signals applied from said band separation circuit and for providing a plurality of combined logic signals to said mode control circuit, wherein said first logic combination circuit includes first and second inverters connected to a vertical frequency-to-voltage converter of said ban separation circuit, a third inverter coupled to a horizontal frequency band separator of band separation circuit, and an AND gate coupled to a horizontal frequency-band separator of band separation circuit and said third inverter.

4. In a mode detector of a multimode monitor including a mode control circuit for controlling a mode of monitor by being switched according to an applied control signal, said detector comprising:

a band separation circuit for separating inputted vertical and horizontal frequency signals according to band and for providing a plurality of logic signals; and a control signal generating circuit composed of first and second logic combination circuits for combining a plurality of logic signals applied from said band separation circuit and for providing a plurality of combined logic signals to said mode control circuit, wherein said second logic combination circuit include:

a NAND gate of which one terminal is connected to an output terminal of the second inverter of said first logic combination circuit and the other terminal is connected to an output terminal of AND gate of said first logic combination circuit;

NAND gate of which one terminal is connected to an output terminal of the first inverter of said first logic combination circuit and the other terminal is connected to an output terminal of the AND gate of said first logic combination circuit;

NAND gate of which one terminal is connected to an output terminal of the first inverter of said first logic combination circuit and the other terminal is connected to an output terminal of the fourth inverter of said first logic combination circuit; and three inverters respectively connected to said three NAND gates.

* * * * *